(12) United States Patent
Jeon et al.

(10) Patent No.: US 8,872,323 B2
(45) Date of Patent: Oct. 28, 2014

(54) STACK PACKAGE (71) Applicant: SK Hynix Inc., Icheon-si (KR)

(72) Inventors: Seon Kwang Jeon, Icheon-si (KR);
Chang Il Kim, Busan (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/941,929

(22) Filed: Jul. 15, 2013

(65) Prior Publication Data

US 2014/0285253 A1 Sep. 25, 2014

(30) Foreign Application Priority Data

Mar. 21, 2013 (KR) ........................ 10-2013-0030180

(51) Int. Cl.
*H01L 23/02* (2006.01)
*H01L 25/065* (2006.01)
*G11C 8/12* (2006.01)

(52) U.S. Cl.
CPC .............. *G11C 8/12* (2013.01); *H01L 25/0657* (2013.01)
USPC .......................................... 257/686; 257/777

(58) Field of Classification Search
CPC ................. H01L 25/0657; H01L 2224/48091
USPC ................................. 257/686, 777
See application file for complete search history.

(56) References Cited

U.S. PATENT DOCUMENTS

| | | | | |
|---|---|---|---|---|
| 8,198,915 B2 * | 6/2012 | Yoko | ................................ | 326/56 |
| 8,411,478 B2 * | 4/2013 | Yun et al. | ........................ | 365/63 |
| 8,499,187 B2 * | 7/2013 | Kim et al. | ...................... | 713/502 |
| 8,713,349 B2 * | 4/2014 | Byeon et al. | .................. | 713/502 |
| 2008/0204091 A1 * | 8/2008 | Choo et al. | ..................... | 327/149 |
| 2011/0025635 A1 * | 2/2011 | Lee | ................. | 345/173 |
| 2011/0084729 A1 * | 4/2011 | Yoko | ............................. | 326/56 |
| 2011/0156800 A1 * | 6/2011 | Lee et al. | ...................... | 327/517 |
| 2012/0007624 A1 * | 1/2012 | Byeon et al. | ............. | 324/750.15 |
| 2012/0154020 A1 * | 6/2012 | Lee et al. | ...................... | 327/530 |
| 2012/0194228 A1 * | 8/2012 | Choi | ................ | 327/117 |
| 2013/0241314 A1 * | 9/2013 | Yun et al. | ...................... | 307/125 |

FOREIGN PATENT DOCUMENTS

KR 1020120004768 A 1/2012
KR 1020120069255 A 6/2012

* cited by examiner

*Primary Examiner* — Adam Houston (74) *Attorney, Agent, or Firm* — William Park & Associates Patent Ltd.

(57) ABSTRACT

A stack package may include a plurality of chips stacked with a plurality of layers; and a chip selection controller configured to provide a reference and chip selection control signal to the plurality of chips. Each chip may comprise: a reference signal controller configured to transmit the reference signal through a first line interconnecting the plurality of chips; a chip selection delay unit configured to control a delay timing point of the chip selection control signal to transmit the control result to each node of a second line interconnecting the plurality of chips; a delay-time-difference sensing unit configured to calculate a delay time difference between a signal applied to each node of the first and second line to generate chip selection information corresponding to the calculated delay time difference; and a memory unit configured to store the chip selection information.

20 Claims, 9 Drawing Sheets

STACK PACKAGE

CROSS-REFERENCE TO RELATED APPLICATION

This application claims priority based upon Korean patent application No. 10-2013-0030180, filed on Mar. 21, 2013, the disclosure of which is hereby incorporated in its entirety by reference herein.

BACKGROUND

1. Field of the Invention

Embodiments of the present invention relate to a stack package, and more particularly to a technology capable of easily selecting a specific chip in a chip stack package formed of stacked Through Silicon Vias (TSVs).

2. Related Art

In recent times, the demand of super-miniaturized and high-capacity semiconductor memories is rapidly increasing in response to a miniaturization and a higher-performance of electronic appliances and the increasing demand of mobile products. Generally, a variety of methods for increasing storage capacity of semiconductor memories have been widely used. First, one method for increasing storage capacity of semiconductor memories is to increase the integration degree of semiconductor chips. Second, another method for increasing storage capacity of semiconductor memories is to populate and assemble a plurality of semiconductor chips into a single semiconductor package.

The method of increasing storage capacity of semiconductor memories requires much more efforts and costs and much longer time. However, the method of increasing the integration degree of semiconductor chips is able to easily increase storage capacity of semiconductor memories by changing only the packaging method.

In addition, the method of increasing the integration degree of semiconductor chips is more advantageous than the method of increasing storage capacity of semiconductor memories in terms of costs, efforts, and time consumed in development and research environments. As a result, manufacturers of semiconductor memories have made efforts to increase storage capacity of semiconductor memory devices through multi-chip packaging in which multiple semiconductor chips are populated on a single semiconductor package.

For example, in order to populate a plurality of semiconductor chips into a single semiconductor package, a method for horizontally populating a semiconductor chip and a method for vertically populating a semiconductor chip into a single semiconductor package may be used. However, due to the pursuit of miniaturization of electronic appliances, most semiconductor memory manufacturers prefer to use Stack Type Multi Chip Packaging in which multiple semiconductor chips are vertically stacked and packaged. A representative example of such stack packages is to use packaging based on Through Silicon Via (TSV).

Figure 1:
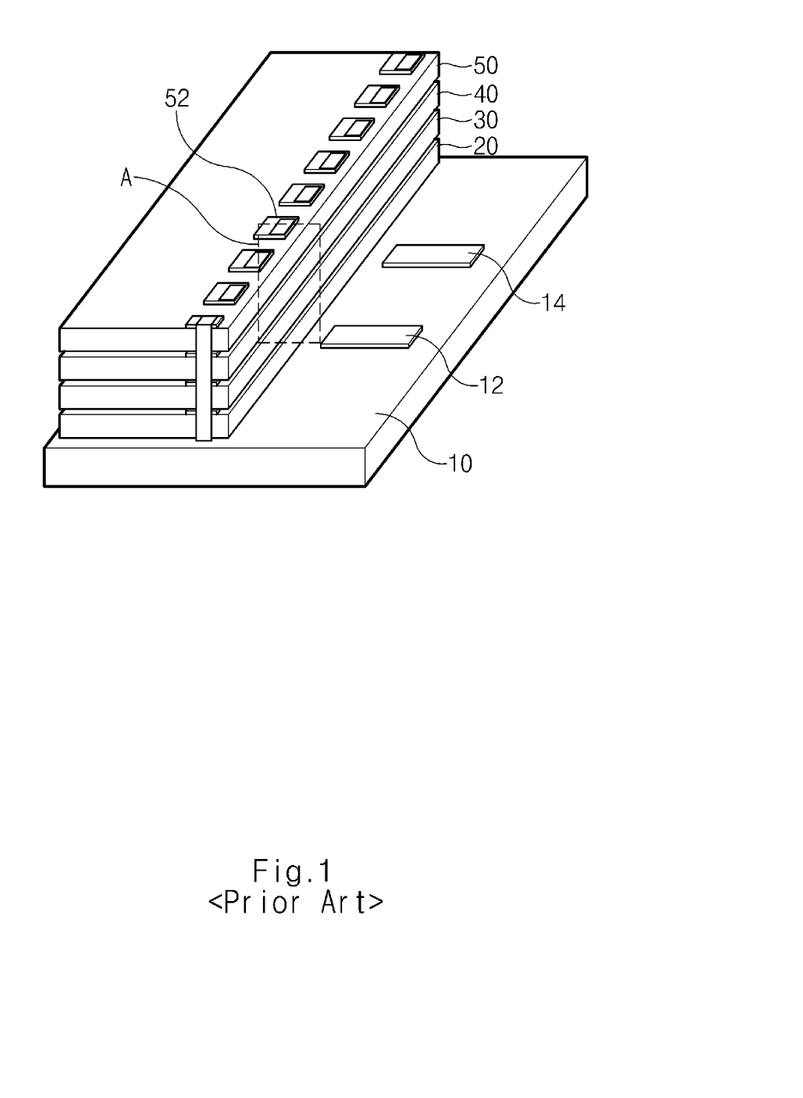
FIG. 1 is a perspective view illustrating a conventional stack package according to the related art.
Figure 2:
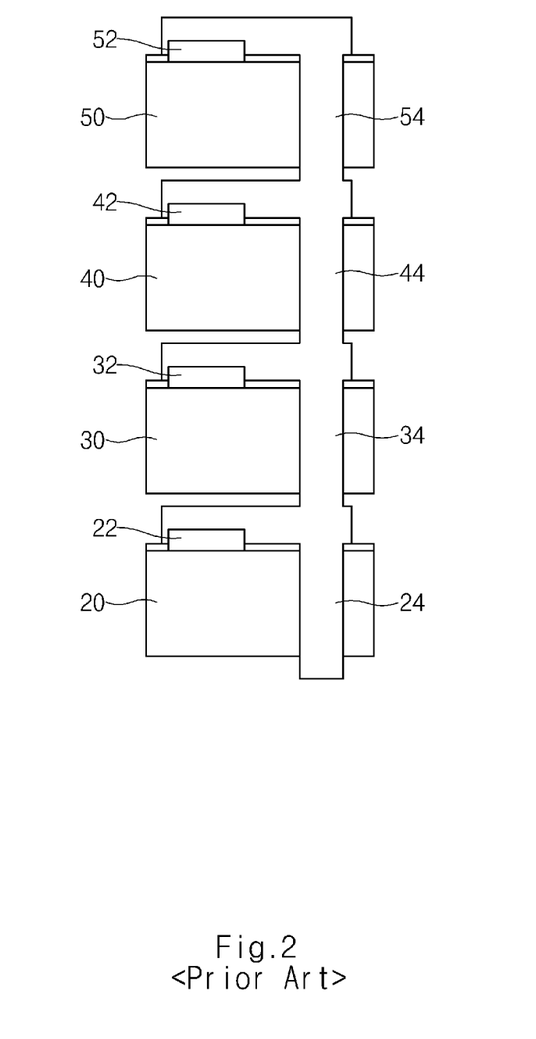
FIG. 2 is a cross-sectional view illustrating a chip-selection pad part of FIG. 1.
Figure 3:
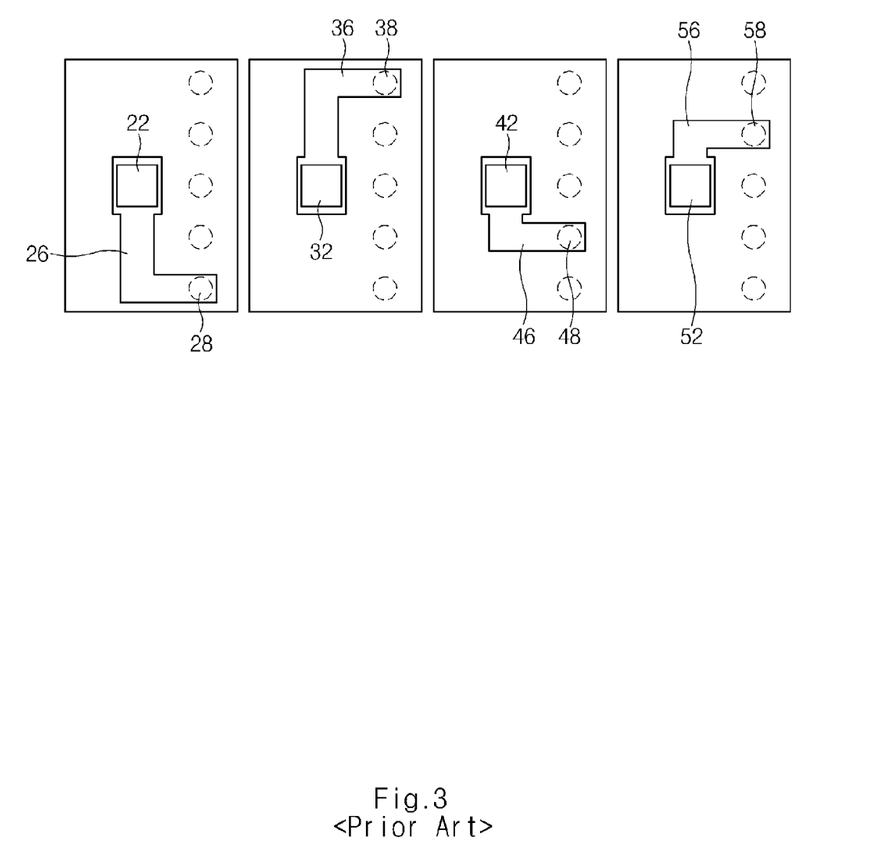
FIG. 3 is a diagram illustrating exemplary connection of a chip-selection pad through redistribution layers (RDLs) of FIG. 1.

FIG. 1 is a perspective view illustrating a conventional stack package according to the related art. FIG. 2 is a cross-sectional view illustrating a specific part (i.e., a chip-selection pad part) of FIG. 1. FIG. 3 is a diagram illustrating a connection of a chip-selection pad through redistribution layers.

The conventional stack package shown in FIG. 1 is formed by stacking semiconductor chips (20, 30, 40, 50) on a substrate 10. The semiconductor chips (20, 30, 40, 50) are connected to TSVs (24, 34, 44, 54) as shown in FIG. 2.

A power-supply voltage VCC, a pad 12, a ground voltage VSS, and a pad 14 are present on the substrate 10. In addition, various I/O pads are present in each of the semiconductor chips (20, 30, 40, 50), and some pads are used as chip-selection pads (22, 32, 42, 52) for chip selection.

When the same chip is stacked with TSVs (24, 34, 44, 54), the chip-selection pads (22, 32, 42, 52) are located at the same position, such that it is impossible to perform chip selection using the same TSVs. Therefore, redistribution layers (26, 36, 46, 56) shown in FIG. 3 are formed on chip selection pads (22, 32, 42, 52), respectively, and need to be coupled to TSVs (28, 38, 48, 58) illustrated in FIG. 3 that may be located at different positions.

However, the above-mentioned method unavoidably increases fabrication costs and many fabrication management problems because retribution layers of stacked chips have different patterns. In addition, as many chip-selection pads (22, 32, 42, 52) as the number of stacked semiconductor chips (20, 30, 40, 50) need to be allocated. Therefore, when stacking the semiconductor chips, the number of chip selection pads increases such that the size of a stack package also increases.

SUMMARY OF THE INVENTION

Various embodiments of the present invention are directed to providing a stack package that substantially obviates one or more problems due to limitations and disadvantages of the related art.

An embodiment of the present invention relates to a technology capable of reducing the number of chip-selection pads without increasing the size of a stack package when stacking semiconductor chips.

In accordance with an embodiment of the present invention, a stack package includes a plurality of stacked chips, and a chip selection controller configured to provide a reference signal and a chip selection control signal to the plurality of chips. Each of the chips includes: a reference signal controller configured to transmit the reference signal through a first line interconnecting the plurality of chips; a chip selection delay unit configured to control a delay timing point of the chip selection control signal in different ways so as to transmit the control result to each node of a second line interconnecting the plurality of chips; a delay-time-difference sensing unit configured to calculate a delay time difference between a signal applied to each node of the first line and a signal applied to each node of the second line so as to generate chip selection information corresponding to the calculated delay time difference; and a memory unit configured to store the chip selection information. In accordance with an embodiment of the present invention, a stack package includes a plurality of stacked chips; and a chip selection controller configured to provide a first reference signal, a second reference signal, and a chip selection control signal to the plurality of chips. Each of the chips includes: a first reference signal controller configured to transmit the first reference signal through a third line interconnecting the plurality of chips; a second reference signal controller configured to transmit the second reference signal through a fourth line interconnecting the plurality of chips; a chip selection delay unit configured to control a delay timing point of the chip selection control signal in different ways so as to transmit the control result to each node of a fifth line interconnecting the plurality of chips; a delay-time-difference controller configured to calculate a delay time difference between a signal applied to each node of the third line and a signal applied to each node of the fourth line so as to generate chip selection information corresponding to the calculated delay time difference, and decode chip selection information; and a memory unit configured to store the chip selection information and decoded information of the delay-time-difference controller.

In accordance with an embodiment of the present invention, a stack package system comprises: a plurality of stacked chips; and a chip selection controller configured to select one or more of the plurality of chips by adjusting a delay time of a reference signal and a chip selection control signal. The plurality of chips comprise: a reference signal controller configured to transmit the reference signal through a first line which connects the plurality of chips; a chip selection delay unit configured to control a delay timing point of the chip selection control signal and transmit the control result to a plurality of nodes interconnecting the plurality of chips; a delay-time-difference sensing unit configured to calculate a difference in a signal delay between the reference signal controller and the chip selection delay unit; and a memory unit to store chip selection information that corresponds to each chip.

The stack package, wherein the first line is configured to connect a plurality of Through Silicon Vias (TSVs) to receive a pulse-shaped reference signal from the chip selection controller.

The stack package, wherein the plurality of chips further comprise: a second line configured to connect the plurality of TSVs to receive the chip selection control signal from the chip selection controller.

The stack package, wherein the reference signal controller and the chip selection delay unit can delay the reference signal and the chip selection control signal.

The stack package, wherein delay amounts delayed by the reference signal controller of the reference signal and the chip selection control signal are identical and/or different from each other.

The stack package, wherein delay amounts delayed by the chip selection delay unit of the reference signal and the chip selection control signal are identical and/or different from each other.

The stack package, wherein the delay-time-difference sensing unit calculates a difference in a signal transmission time between the plurality of nodes.

The stack package, wherein the memory unit stores the difference in the signal transmission time between the plurality of nodes.

The stack package, wherein the reference signal and the chip selection control signal applied to one or more of the plurality of nodes will have the same delay time.

The stack package, wherein the delay time of the chip selection control signal is adjusted to select one or more of the plurality of chips.

A memory system comprises: a memory controller; and a semiconductor memory device including a stack package, the stack package comprising: a plurality of stacked chips; and a chip selection controller configured to provide a reference signal and a chip selection control signal to the plurality of chips, wherein each of the chips comprise: a reference signal controller configured to transmit the reference signal through a first line interconnecting the plurality of chips; a chip selection delay unit configured to control a delay timing point of the chip selection control signal in different ways so as to transmit the control result to each node of a second line interconnecting the plurality of chips; a delay time-difference sensing unit configured to calculate a delay time difference between a signal applied to each node of the first line and a signal applied to each node of the second line so as to generate chip selection information corresponding to the calculated delay time difference; and a memory unit configured to store the chip selection information.

An electronic device may comprise: a memory system communicatively coupled to a central processing unit; the memory system including a semiconductor memory device comprising: a plurality of stacked chips; and a chip selection controller configured to provide a reference signal and a chip selection control signal to the plurality of chips, wherein each of the chips comprise: a reference signal controller configured to transmit the reference signal through a first line interconnecting the plurality of chips; a chip selection delay unit configured to control a delay timing point of the chip selection control signal in different ways so as to transmit the control result to each node of a second line interconnecting the plurality of chips; a delay-time-difference sensing unit configured to calculate a delay time difference between a signal applied to each node of the first line and a signal applied to each node of the second line so as to generate chip selection information corresponding to the calculated delay time difference; and a memory unit configured to store the chip selection information.

It is to be understood that both the foregoing general description and the following detailed description of the present invention are explanatory and are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Reference will now be made in detail to various embodiments of the present invention, examples of which are illustrated in the accompanying drawings. Wherever possible, the same reference numbers will be used throughout the drawings to refer to the same or like parts.

Figure 4:
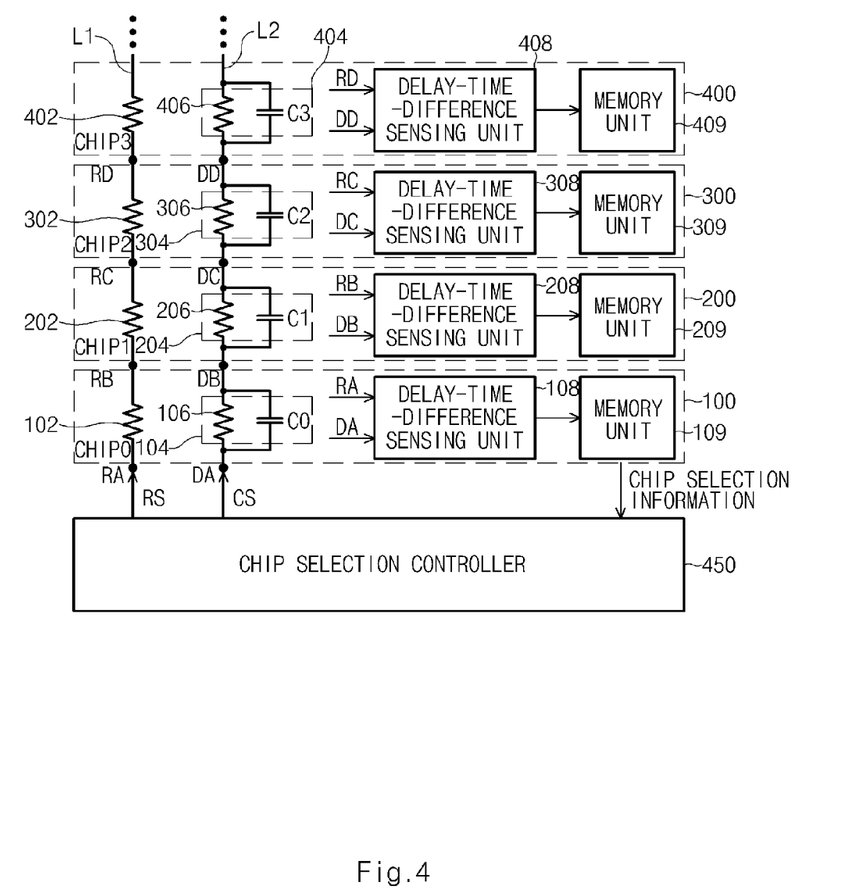
FIG. 4 is a block diagram illustrating a stack package according to an embodiment of the present invention.

FIG. 4 is a block diagram illustrating a stack package according to an embodiment of the present invention.

Referring to FIG. 4, a stack package according to an embodiment of the present invention may include a plurality of chips (100, 200, 300, 400). For example, each of the semiconductor chips (100, 200, 300, 400) may be stacked with four layers.

Each chip (100, 200, 300, or 400) may include a reference signal controller (102, 202, 302, or 402), a chip selection delay unit (104, 204, 304, or 404), a delay-time-difference sensing unit (108, 208, 308, or 408), and a memory unit (109,

209, 309, or 409), and a chip selection controller 450. Each chip (100, 200, 300, or 400) respectively were to may comprise the chip selection controller 450. The chip selection delay unit (104, 204, 304, or 404) may include a delay unit (106, 206, 306, or 406) and a delay controller (C0, C1, C2, or C3).

In addition, each chip (100, 200, 300, or 400) may include two or more TSVs. A first line L1 may be configured to serially interconnect a plurality of TSVs (not shown) and may receive a pulse-shaped reference signal RS from the chip selection controller 450; and a second line L2 may be configured to interconnect a plurality of TSVs (not shown) and may receive a chip selection control signal (CS) from the chip selection controller 450.

The chip selection controller 450 may select any one of respective chips (100, 200, 300, 400) by adjusting an enable timing point (i.e., a delay time) of each of the reference signal RS and the chip selection control signal CS.

The reference signal controllers (102, 202, 302, 402) and the chip selection delay units (104, 204, 304, 404) for use in the respective chips (100, 200, 300, 400) may have no limitation in structure in so far as they can delay the reference signal RS and the chip selection control signal CS.

For example, the reference signal controller (102, 202, 302, or 402) may be a TSV. That is, a TSV may be used as a resistor. Alternatively, the reference signal controller (102, 202, 302, or 402) may be a resistor separately formed on a TSV.

In addition, the delay amounts delayed by respective delay units of the reference signal controllers (102, 202, 302, 402) may be identical to or different from each other. In addition, the delay amounts delayed by respective delay units of the chip selection delay units (104, 204, 304, 404) may be identical to or different from each other.

For example, the delay amounts delayed by respective delay units of the reference signal controllers (102, 202, 302, 402) may be identical to each other; and the delay amounts delayed by respective delay units of the chip selection delay units (104, 204, 304, 404) may be identical to each other. However, the delay amount of the reference signal controller (102, 202, 302, or 402) may be different from the delay amount of the chip selection delay unit (104, 204, 304, or 404) as necessary.

The reference signal controllers (102, 202, 302, 402) may be coupled in series to the first line L1. The delay units (106, 206, 306, 406) of the chip selection delay units (104, 204, 304, 404) may be coupled in series to the second line L2. The delay controllers (C0, C1, C2, C3) may be coupled in parallel to the delay units (106, 206, 306, 406), respectively. In this case, each of the delay controllers (C0, C1, C2, C3) serving as the delay units may include a capacitor.

The delay amount of the reference signal RS of the reference signal controllers (102, 202, 302, 402) an the delay amount of the chip selection control signal CS of the chip selection delay units (104, 204, 304, 404) may be output to the delay-time-difference sensing units (108, 208, 308, 408). The delay-time-difference sensing unit (108, 208, 308, or 408) may calculate a difference in signal delay amount between the reference signal controller (102, 202, 302, or 402) and the chip selection delay unit (104, 204, 304, or 404); and the delay-time-difference sensing units (108, 208, 308, 408) may store chip selection information corresponding to each chip (100, 200, 300, or 400) in the memory unit (109, 209, 309, or 409).

That is, the delay-time-difference sensing unit 108 may calculate a difference in signal transmission time between a node RA and a node DA. The delay-time-difference sensing unit 208 may calculate a difference in signal transmission time between a node RB and a node DB. The delay-time-difference sensing unit 308 may calculate a difference in signal transmission time between a node RC and a node DC. The delay-time-difference sensing unit 408 may calculate a difference in signal transmission time between a node RD and a node DD.

In this case, there may be no difference in signal transmission time between the node RA and the node DA. There may be a little difference in signal transmission time between the node RB and the node DB. In addition, there may be an even greater difference in signal transmission time between the node RC and the node DC. The largest difference in signal transmission time may be between the node RD and the node DD. Here, the reference signal RS provided to each node (RA, RB, RC, RD) may serve as a trigger signal of the chip selection control signal CS.

Chip selection information generated from the delay-time-difference sensing unit (108, 208, 308, or 408) may be stored in the memory unit (109, 209, 309, or 409).

Figure 5:
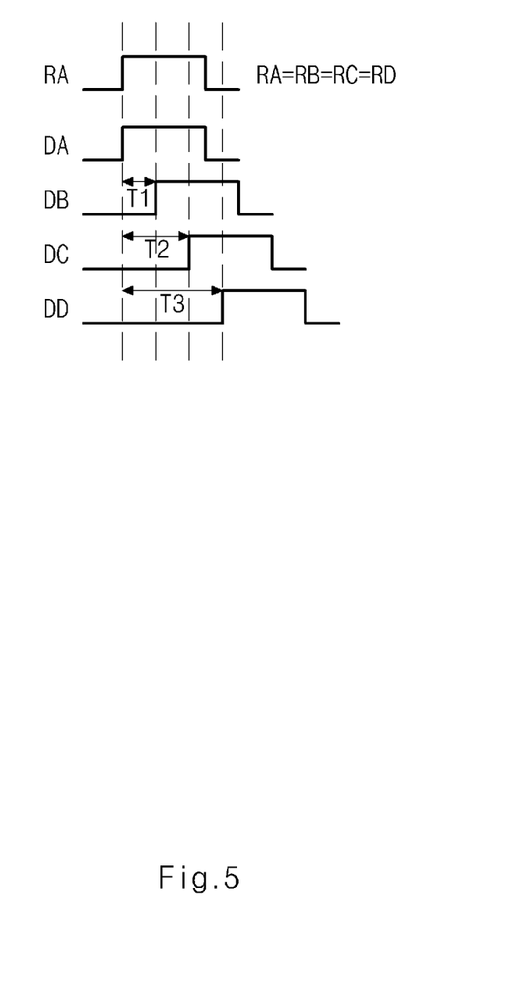
FIGS. 5 and 6 are timing diagrams illustrating the stack package shown in FIG. 4 according to an embodiment of the present invention.
Figure 6:
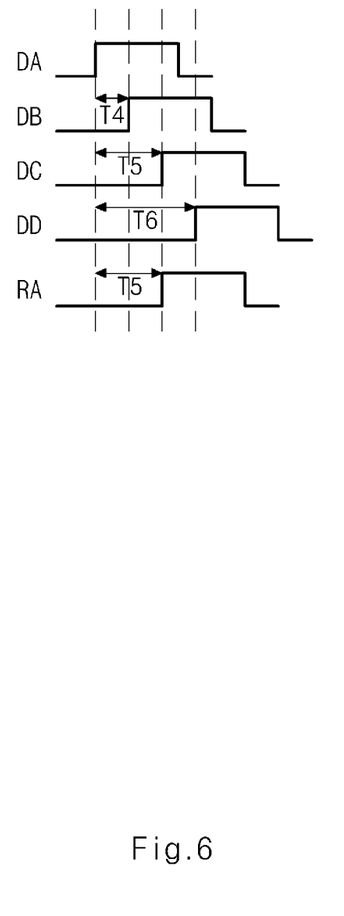

FIGS. 5 and 6 are timing diagrams illustrating the stack package shown in FIG. 4 according to an embodiment of the present invention. The operations of the stack package shown in FIG. 4 will hereinafter be described with reference to the attached drawings.

Referring to FIG. 4, the chip selection method of the stack package according to an embodiment of the present invention may output a reference signal RS having a rectangular pulse to the first line L1 configured to serially interconnect the reference signal controllers (102, 202, 302, 402) respectively contained in the chips (100, 200, 300, 400).

The above-mentioned chip selection method of the stack package may output the chip selection control signal CS having a rectangular pulse to the second line L2 configured to serially interconnect the chip selection delay units (104, 204, 304, 404) respectively contained in the chips (100, 200, 300, 400).

In this case, the reference signal RS applied to the node RA of the first line L1 and the chip selection control signal CS applied to the node DA of the second line L2 may have the same enable timing point. Although the reference signal RS and the chip selection control signal CS may have the same pulse width or different pulse widths, the reference signal RS and the chip selection control signal CS may have the same enable timing point. Since the node RA and the node DA do not have a node delay amount caused by a capacitor, the signal transmission timing point of the node RA may be identical to that of the node DA when calculating a difference in time between the node RA and the node DA.

However, the delay controller C0 may be present between the node DA and the node DB. Accordingly, signal delay caused by capacitance of the delay controller C0 may occur between the node DA and the node DB.

On the other hand, no delay amount caused by a capacitor may occur between the node RA and the node RB, such that the signal transmission timing point of the node RA may be identical to that of the node RB when calculating a difference in time between the node RA and the node DB. That is, when comparing the node RB with the node DB, it can be recognized that a time difference generated between the node RB and the node DB may be longer than a time difference generated between the node RA and the DA.

The same signal transmission timing information at the node RA and the node RB is calculated by the delay-time-difference sensing unit 108 and then stored in the memory unit 109. In other words, when the signal transmission timing point at the node RA is identical to that of the node DA, the memory unit 109 may store selection information indicating that the corresponding chip is a first chip 100.

A difference in signal transmission time between the node RB and the node DB may be calculated by the delay-time-difference sensing unit 208, and then stored in the memory unit 209. That is, information regarding a time difference between the node RA and the node DB may be stored as selection information of the second chip 200 in the memory unit 209.

Capacitance caused by the delay controllers (C0, C1) may be present between the node DA and the node DC. Accordingly, when comparing the node RC with the node DC, a time difference between the node RC and the node DC may be longer than a time difference between the node RA and the node DA. Here, a difference in signal transmission time between the node RC and the node DC may be calculated by the delay-time-difference sensing unit 308, and then stored in the memory unit 309. That is, information regarding a time difference between the node RA and the node DC may be stored as selection information of the third chip 300 in the memory unit 309.

Capacitance caused by the delay controllers C0~C2 may be present between the node DA and the node DD. Accordingly, when comparing the node RD with the node DD, a time difference between the node RD and the node DD may be longer than a time difference between the node RA and the node DA. Here, a difference in signal transmission time between the node RD and the node DD may be calculated by the delay-time-difference sensing unit 408, and then stored in the memory unit 409. That is, information regarding a time difference between the node RA and the node DD is stored as selection information of the fourth chip 400 in the memory unit 409.

As described above, a constant delay timing point of the reference signal RS may be obtained from the first line L1, and a delay time of the chip selection control signal CS may increase on the second line L2 whenever the chip selection control signal CS passes through respective resistors by capacitances of the delay controllers C0~C3.

For example, under the condition that the stack package is powered up, each of the nodes (RA, RB, RC, RD) may not have a delay time caused by capacitance on the first line L1 as shown in FIG. 5, such that the nodes (RA, RB, RC, RD) may have the same delay time. Since the chip selection controller 450 may apply the chip selection control signal (CS) pulse at the same timing point as that of an enable signal of the node (RA), the node DA and the node RA may have the same time difference.

However, a delay-time difference between the node DB and the node DA may denoted by a specific time T1, and the time of the node DB may be more delayed than that of the node DA by a specific time T1, such that the node DB may be enabled with the delay time difference of T1. That is, after lapse of a specific time T1 under the condition that the node DA is enabled with a high level, the node DB may be enabled with a high level.

The time of the node DC may be more delayed than that of the node DA by a specific time T2, such that the node DC may be enabled with the delay time difference of T2. That is, after lapse of a specific time T2 under the condition that the node DA is enabled with a high level, the node DC may be enabled with a high level.

The time of the node DD may be more delayed than that of the node DA by a specific time T3, such that the node DD may be enabled with the delay time difference of T3. That is, after lapse of a specific time T3 under the condition that the node DA is enabled with a high level, the node DD may be enabled with a high level. Here, T2 may be longer than T1, and T3 may be longer than T2.

On the other hand, in order to select individual chips after the stack package is powered up, the enable timing point of the chip selection control signal CS may be controlled as shown in FIG. 6.

In other words, a delay time of the chip selection control signal CS may increase on the second line L2 whenever the chip selection control signal CS passes through respective resistors by capacitances of the delay controllers C0~C3. Therefore, the chip selection control signal CS having passed through the delay controllers C0~C3 of the second line L2 may have a constant delay time difference at each of the nodes (DA, DB, DC, DD); and the chip selection control signals (CS) obtained from individual nodes (DA, DB, DC, DD) may be sequentially enabled.

The time of the node DB may be more delayed than that of the node DA by a specific time T4, such that the node DB may be enabled with the delay time difference of T4. That is, after lapse of a specific time T4 under the condition that the node DA is enabled with a high level, the node DB may be enabled with a high level.

The time of the node DC may be more delayed than that of the node DA by a specific time T5, such that the node DC may be enabled with the delay time difference of T5. That is, after lapse of a specific time T5 under the condition that the node DA may be enabled with a high level, the DC may be enabled with a high level.

The time of the node DD may be more delayed than that of the node DA by a specific time T6, such that the node DD may be enabled with the delay time difference of T6. That is, after lapse of a specific time T6 under the condition that the node DA is enabled with a high level, the node DD may be enabled with a high level. Here, T5 may be longer than T4, and T6 may be longer than T5.

For example, it is assumed that the chip 300 stacked on a third layer after the stack package is powered up is selected. As a result, the chip selection controller 450 may control the enable timing point of the chip selection control signal CS in a manner that the node (DC) signal is enabled in response to the enable timing point of the node (RA) signal serving as a reference value. In this case, information regarding a signal-delay-time difference between the node RC and the node DC, i.e., chip selection information for selecting the third chip 300, may refer to information stored in the memory unit 300.

That is, after lapse of a delay time T5 upon activation of the node DA, the node (DC) signal may be enabled to be synchronized with the enable timing point of the node (RA) signal. In other words, the chip selection control signal CS may be first enabled prior to a specific time T5 starting from the enable timing point of the reference signal RS.

For convenience of description and better understanding of the present invention, the enable timing point of the node (RS) signal serving as a reference signal may be synchronized with the enable timing point of the node (DC) signal of the selected chip 300. That is, the edge regions of signal waveforms of two nodes (RA, DC) may be aligned with each other. However, the scope or spirit of the present invention is not limited thereto, and the center region of a signal waveform of the node RA serving as a reference may also be aligned with the center region of a signal waveform of the node DC of the selected chip 300 as necessary.

In order to select the lowest chip 100, the enable timing point of the node DA may be synchronized with the enable timing point of the node RA. In order to select the chip 200 stacked on a second layer, the enable timing point of the node DB may be synchronized with the enable timing point of the node RA. In addition, in order to select the chip 400 stacked on a fourth layer, the enable timing point of the node DD may be synchronized with the enable timing point of the node RA.

As described above, when the stack package is powered up, delay-time-difference information associated with the node (DA, DB, DC, or DD) on the basis of the node RA may be stored in the memory unit (109, 209, 309, or 409) of the chip (100, 200, 300, or 400).

During a normal chip selection operation of the stack package, the enable timing point of the node (DA, DB, DC, or DD) may be controlled using time-difference information stored in the memory unit (109, 209, 309, or 409) so that a desired chip can be selected.

Although an embodiment of the present invention has exemplarily disclosed the chip selection apparatus, method, and system for use in the stack package for convenience of description and better understanding of the present invention, the scope or spirit of the present invention is not limited thereto; and may also be applied to the clock enable signal selection apparatus and method for use in the stack package as necessary.

Figure 7:
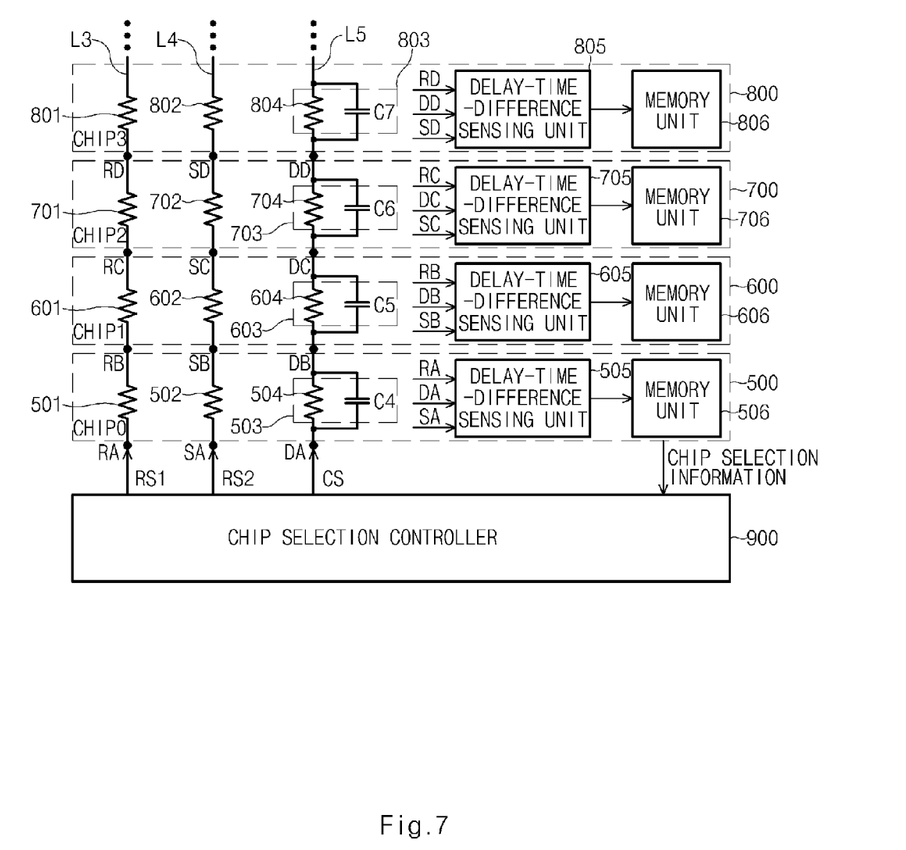
FIG. 7 is a block diagram illustrating a stack package according to an embodiment of the present invention.

FIG. 7 is a block diagram illustrating a stack package according to an embodiment of the present invention.

Referring to FIG. 7, the stack package according to an embodiment of the present invention may include a plurality of chips (500, 600, 700, 800). For example, each of the semiconductor chips (500, 600, 700, 800) may be stacked with four layers.

Each chip (500, 600, 700, or 800) may include a first reference signal controller (501, 601, 701, or 801), a second reference signal controller (502, 602, 702, or 802), a chip selection delay unit (503, 603, 703, or 803), a delay-time-difference sensing unit (505, 605, 705, or 805), a memory unit (506, 606, 706, or 806), and a chip selection controller 900. In this case, the chip selection delay unit (503, 603, 703, or 803) may include a delay unit (504, 604, 704, or 804) and a delay controller (C4, C5, C6, or C7).

In addition, each chip (500, 600, 700, or 800) may include two or more TSVs. A third line L3 configured to serially interconnect a plurality of TSVs (not shown) may receive a pulse-shaped reference signal RS1 from the chip selection controller 900; a fourth line L4 configured to interconnect a plurality of TSVs (not shown) may receive a pulse-shaped reference signal RS2 from the chip selection controller 900; and a fifth line L5 configured to interconnect a plurality of TSVs (not shown) may receive a chip selection control signal (CS) from the chip selection controller 900.

The chip selection controller 900 may adjust the enable timing point (i.e., a delay time) of each of the reference signal RS1 and the chip selection control signal CS during the power-up operation, such that it may store chip selection information corresponding to each chip (500, 600, 700, 800).

During the normal operation, the chip selection controller 900 may select one of the chips (500, 600, 700, 800) according to a combination of the reference signals (RS1, RS2).

The chip selection delay units (503, 603, 703, 803) for use in respective chips (500, 600, 700, or 800) may have no limitation in structure in so far as they can delay the chip selection control signal CS received from the chip selection controller 900.

For example, the delay unit (504, 604, 704, or 804) may be a TSV. That is, a TSV may be used as a resistor. Alternatively, the delay unit (504, 604, 704, or 804) may be a resistor separately formed on a TSV.

In addition, the delay amounts delayed by respective delay units of the first reference signal controllers (501, 601, 701, 801) may be identical to or different from each other. In addition, the delay amounts delayed by respective delay units of the chip selection delay units (503, 603, 703, 803) may be identical to or different from each other.

For example, the delay amounts delayed by respective delay units of the first reference signal controller (501, 601, 701, 801) may be identical to each other; and the delay amounts delayed by respective delay units of the chip selection delay units (503, 603, 703, 803) may be identical to each other. However, the delay amount of the first reference signal controller (501, 601, 701, or 801) may be different from the delay amount of the chip selection delay unit (503, 603, 703, 803) as necessary.

The first reference signal controllers (501, 601, 701, 801) may be coupled in series to the third line L3. The second reference signal controllers (502, 602, 702, 802) may be coupled in series to the fourth line L4. The delay units (504, 604, 704, 804) of the chip selection delay units (503, 603, 703, 803) may be coupled in series to the fifth line L5. The delay controllers (C4, C5, C6, C7) may be coupled in parallel to the delay units (504, 604, 704, 804), respectively. In this case, each of the delay controllers (C4, C5, C6, C7) serving as the delay units may include a capacitor.

The delay amount of the reference signal RS1 of the first reference signal controllers (501, 601, 701, 801) and the delay amount of the chip selection control signal CS of the chip selection delay units (503, 603, 703, 803) may be output to the delay-time-difference sensing units (505, 605, 705, 805).

During the power-up operation, the delay-time-difference controller (505, 605, 705, or 805) may calculate a difference in signal delay amount between the first reference signal controller (501, 601, 701, or 801); and the chip selection delay unit (503, 603, 703, or 803); and may store chip selection information corresponding to each chip (500, 600, 700, or 800) in the memory unit (506, 606, 706, or 806).

That is, the delay-time-difference controller 505 may calculate a difference in signal transmission time between the node RA and the node DA. The delay-time-difference controller 605 may calculate a difference in signal transmission time between the node RB and the node DB. The delay-time-difference controller 705 may calculate a difference in signal transmission time between the node RC and the node DC. The delay-time-difference controller 805 may calculate a difference in signal transmission time between the node RD and the node DD.

In this case, there may be no difference in signal transmission time between the node RA and the node DA. There may be a little difference in signal transmission time between the node RB and the node DB. There may be a greater difference in signal transmission time between the node RC and the node DC than between the node RB and the node DB. The largest difference in signal transmission time may be between the node RD and the node DD. Here, the reference signal RS1 may be provided to each node (RA, RB, RC, RD) to serve as a trigger signal of the chip selection control signal CS.

The delay-time-difference controller (505, 605, 705, or 805) may decode a difference in signal delay amount between the first reference signal controller (501, 601, 701, or 801) and the chip selection delay unit (503, 603, 703, or 803); and may store chip selection information corresponding to each chip (500, 600, 700, 800) in the memory unit (506, 606, 706, or 806). During the normal operation, the delay-time-difference controller (505, 605, 705, or 805) may determine whether a decoded signal of a combination signal of the output signals of the first reference signal controller (501, 601, 701, or 801); and the second reference signal controller (502, 602, 702, or 802) is identical to chip selection information stored in the memory unit (506, 606, 706, or 806), and thus may select the corresponding chip according to the determination result.

The operations of the stack package according to another embodiment of the present invention will hereinafter be described in detail.

The power-up operation of the stack package according to an embodiment of the present invention will hereinafter be described in detail. When the stack package is powered up, the fourth line L4 may not be used.

The chip selection method of the stack package according to an embodiment of the present invention may output a reference signal RS1 having a rectangular pulse to the third line L3 configured to serially interconnect the first reference signal controllers (501, 601, 701, 801) respectively contained in the chips (500, 600, 700, 800).

The above-mentioned chip selection method of the stack package may output the chip selection control signal CS having a rectangular pulse to the fifth line L5 configured to serially interconnect the chip selection delay units (503, 603, 703, 803) respectively contained in the chips (500, 600, 700, 800).

In this case, the reference signal RS1 applied to the node RA of the third line L3 and the chip selection control signal CS applied to the node DA of the fifth line L5 may have the same enable timing point. Although the reference signal RS1 and the chip selection control signal CS may have the same pulse width or different pulse widths, the reference signal RS1 and the chip selection control signal CS may have the same enable timing point. Since the node RA and the node DA may not have a node delay amount caused by a capacitor, the signal transmission timing point of the node RA may be identical to that of the node DA when calculating a difference in time between the node RA and the node DA.

However, the delay controller C4 may be present between the node DA and the node DB. Accordingly, signal delay caused by capacitance of the delay controller C4 may occur between the node DA and the node DB.

On the other hand, no delay amount caused by a capacitor may occur between the node RA and the node RB, such that the signal transmission timing point of the node RA may be identical to that of the node RB when calculating a difference in time between the node RA and the node DB. That is, when comparing the node RB with the node DB, it can be recognized that a time difference generated between the node RB and the node DB may be longer than a time difference generated between the node RA and the DA.

The same signal transmission timing information at the node RA and the node RB may be calculated by the delay-time-difference controller 505, and the delay-time-difference controller 505 may decode the calculation result and stores the decoded result in the memory unit 506. In other words, when the signal transmission timing point at the node RA is identical to that of the node DA, the memory unit 506 may store selection information indicating that the corresponding chip is a first chip 500.

A difference in signal transmission time between the node RB and the node DB may be calculated by the delay-time-difference controller 605; and the delay-time-difference controller 605 may decode the calculation result and may store the decoded result in the memory unit 606. That is, information regarding a time difference between the node RA and the node DB may be stored as selection information of the second chip 600 in the memory unit 606.

Capacitance caused by the delay controllers (C4, C5) may be present between the node DA and the node DC. Accordingly, when comparing the node RC with the node DC, a time difference between the node RC and the node DC may be longer than a time difference between the node RA and the node DA. Here, a difference in signal transmission time between the node RC and the node DC may be calculated by the delay-time-difference controller 705; and the delay-time-difference controller 705 may decode the calculation result and may store the decoded result in the memory unit 706. That is, information regarding a time difference between the node RA and the node DC may be stored as selection information of the third chip 700 in the memory unit 706.

Capacitance caused by the delay controllers C4~C6 may be present between the node DA and the node DD. Accordingly, when comparing the node RD with the node DD, a time difference between the node RD and the node DD may be longer than a time difference between the node RA and the node DA. Here, a difference in signal transmission time between the node RD and the node DD may be calculated by the delay-time-difference controller 805; and the delay-time-difference controller 805 may decode the calculation result and store the decoded result in the memory unit 806. That is, information regarding a time difference between the node RA and the node DD may be stored as selection information of the fourth chip 800 in the memory unit 806.

As described above, a constant delay timing point of the reference signal RS1 may be obtained from the third line L3, and a delay time of the chip selection control signal CS may increase on the fifth line L5 whenever the chip selection control signal CS passes through respective resistors by capacitances of the delay controllers C4~C7.

For example, under the condition that the stack package is powered up, each of the nodes (RA, RB, RC, RD) may not have a delay time caused by capacitance on the third line L3 as shown in FIG. 5, such that the nodes (RA, RB, RC, RD) may have the same delay time. Since the chip selection controller 900 may apply the chip selection control signal (CS) pulse at the same timing point as that of an enable signal of the node (RA); the node DA and the node RA may have the same time difference.

However, a delay-time difference between the node DB and the node DA may be denoted by a specific time T1, and the time of the node DB may be more delayed than that of the node DA by a specific time T1, such that the node DB is enabled with the delay time difference of T1. That is, after lapse of a specific time T1 under the condition that the node DA is enabled with a high level, the node DB may be enabled with a high level.

The time of the node DC may be more delayed than that of the node DA by a specific time T2, such that the node DC is enabled with the delay time difference of T2. That is, after lapse of a specific time T2 under the condition that the node DA is enabled with a high level, the node DC may be enabled with a high level.

The time of the node DD may be more delayed than that of the node DA by a specific time T3, such that the node DD may be enabled with the delay time difference of T3. That is, after lapse of a specific time T3 under the condition that the node DA is enabled with a high level, the node DD may be enabled with a high level. Here, T2 may be longer than T1, and T3 may be longer than T2.

The normal operation of the stack package according to an embodiment of the present invention will hereinafter be described in detail. In case of the normal operation of the stack package, the third line L3 and the fourth line L4 may be used whereas the fifth line L5 may not be used.

On the other hand, in order to select each chip during the normal operation after the stack package has been powered up, it may be determined whether a combination signal of output signals of the third line L3 and the fourth line L4 is identical to chip selection information stored in the memory units (506, 606, 706, 806).

That is, during the above power-up operation, the delay-time-difference controller (505, 605, 705, or 805) may store chip selection information corresponding to each chip (506, 606, 706, or 806) in the memory unit (506, 606, 706, or 806). The delay-time-difference controller (505, 605, 705, or 805) may compare chip selection information stored in the memory unit (506, 606, 706, or 806) with a combination signal of respective nodes received from the third line L3 and the fourth line L4, such that it may select the corresponding chip according to the comparison result.

For example, it may be assumed that chip selection information stored in the memory unit (506, 606, 706, or 806) of each chip (500, 600, 700, or 800) may be denoted by (0, 0), (0, 1), (1, 0), or (1, 1).

The chip selection controller 900 may output the reference signal RS1 as a digital signal of '0', and may output the reference signal RS2 as a digital signal of '0'. As a result, the delay-time-difference controller 505 may combine the signal of the node RA with the signal of the node SA; and may determine whether the combined result is identical to chip selection information stored in the memory unit 506. Chip selection information stored in the memory unit 506 of the first chip 500 from among a plurality of chips (500, 600, 700, 800) may be identical to the digital signal value of each of the reference signals RS1 and RS2. Accordingly, provided that the reference signal RS1 corresponding to the digital signal '0' and the reference signal RS2 corresponding to the digital signal '0' are applied to the stack package, the first chip 500 may be selected.

The chip selection controller 900 may output the reference signal RS1 as a digital signal of '0', and may output the reference signal RS2 as a digital signal of '1'. As a result, the delay-time-difference controller 605 may combine the signal of the node RB with the signal of the node SB; and may determine whether the combined result is identical to chip selection information stored in the memory unit 606. Chip selection information stored in the memory unit 606 of the second chip 600 from among a plurality of chips (500, 600, 700, 800) may be identical to the digital signal value of each of the reference signals RS1 and RS2. Accordingly, provided that the reference signal RS1 corresponding to the digital signal '0' and the reference signal RS2 corresponding to the digital signal '1' are applied to the stack package, the second chip 600 may be selected.

The chip selection controller 900 may output the reference signal RS1 as a digital signal of '1', and may output the reference signal RS2 as a digital signal of '0'. As a result, the delay-time-difference controller 705 may combine the signal of the node RC with the signal of the node SC; and may determine whether the combined result is identical to chip selection information stored in the memory unit 706. Chip selection information stored in the memory unit 706 of the third chip 700 from among a plurality of chips (500, 600, 700, 800) may be identical to the digital signal value of each of the reference signals RS1 and RS2. Accordingly, provided that the reference signal RS1 corresponding to the digital signal '1' and the reference signal RS2 corresponding to the digital signal '0' are applied to the stack package, the third chip 700 may be selected.

The chip selection controller 900 may output the reference signal RS1 as a digital signal of '1', and may output the reference signal RS2 as a digital signal of '0'. As a result, the delay-time-difference controller 805 may combine the signal of the node RD with the signal of the node SD; and may determine whether the combined result is identical to chip selection information stored in the memory unit 806. Chip selection information stored in the memory unit 806 of the fourth chip 800 from among a plurality of chips (500, 600, 700, 800) may be identical to the digital signal value of each of the reference signals RS1 and RS2. Accordingly, provided that the reference signal RS1 corresponding to the digital signal '1' and the reference signal RS2 corresponding to the digital signal '1' are applied to the stack package, the fourth chip 800 may be selected.

Figure 8:
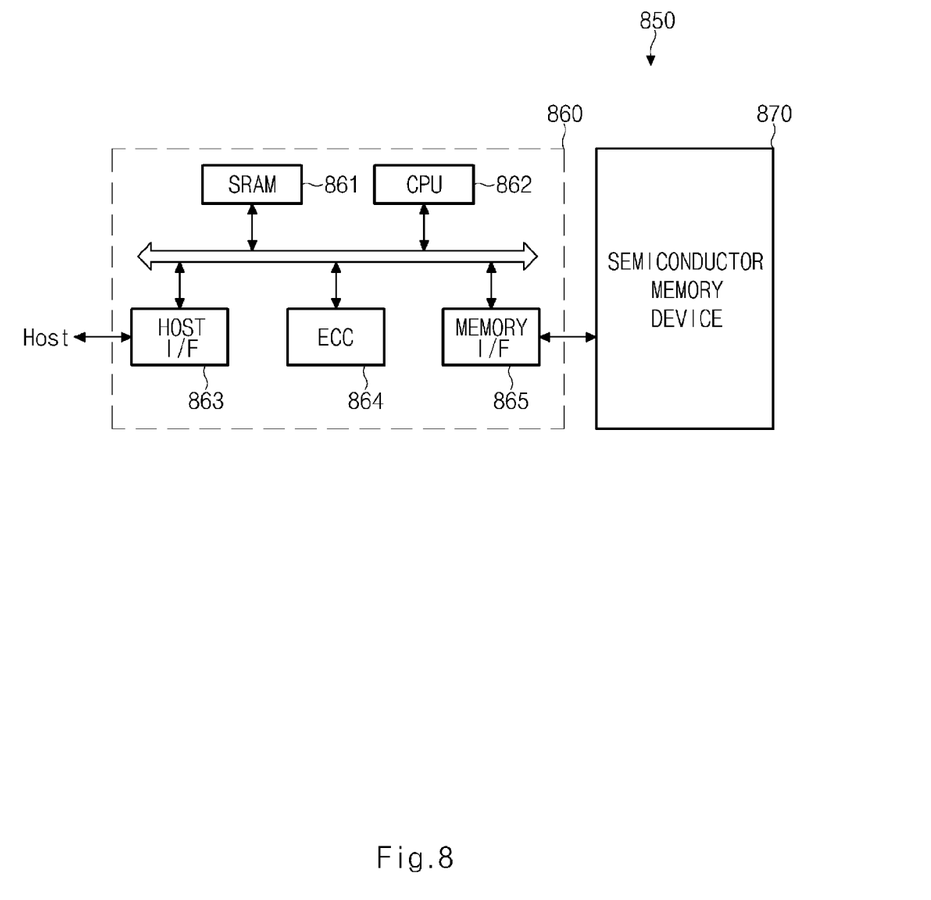
FIG. 8 is a view illustrating a memory system according to an embodiment of the present invention.

FIG. 8 is a block diagram illustrating a memory system according to an embodiment of the present invention.

In FIG. 8, the memory system 850 of an embodiment of the present invention may include a semiconductor memory device 870, a memory controller 860, and a CPU 862.

The semiconductor memory device 870 may serve as a volatile memory device such as a DRAM or a nonvolatile memory device such as MRAM, STT-MRAM, PCRAM, ReRAM, or FeRAM. The semiconductor memory device 870 may be a multi-chip package having flash memory chips.

The memory controller 860 may control the semiconductor memory device 870, and may include an SRAM 861, a host interface 863, an Error-Correction Code Block (ECC) 864, and a memory interface 865. The SRAM 861 may be used as an operation memory of the CPU 862, the CPU 862 may perform control operation for data exchange of the memory controller 860, and the host interface 863 may have data exchange protocol of a host accessed to the memory system 850. The ECC 864 may detect and correct error of data read from the semiconductor memory device 870, and the memory interface 865 may interface with the semiconductor memory device 870. The memory controller 860 may include further ROM for storing data for interfacing with the host, etc.

The memory system 850 may be used as a memory card or a solid state disk SSD by combination of the semiconductor memory device 870 and the memory controller 860. In the event that the memory system 850 is the SSD, the memory controller 860 may communicate with an external device, e.g. host through one of various interface protocols such as USB, MMC, PCI-E, SATA, PATA, SCSI, ESDI, IDE, etc.

Figure 9:
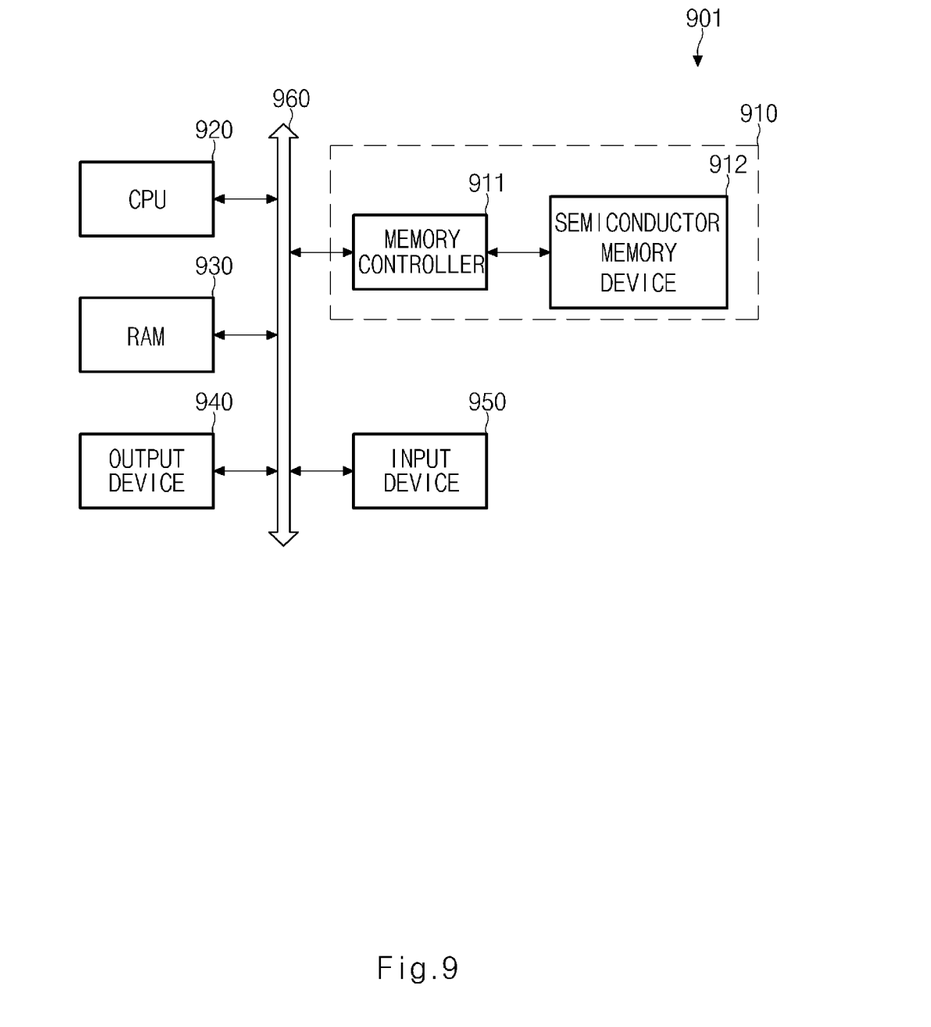
FIG. 9 is a view illustrating a computing system according to an embodiment of the present invention.

FIG. 9 is a view illustrating an electronic device or a computing system according to an embodiment of the present invention.

In FIG. 9, the computing system 901 of various embodiments of the present invention may include a CPU 920 connected electrically to a system bus 960, a RAM 930, an output device 940 or a user interface, an input device 950, and a memory system 910 including a memory controller 911 and a semiconductor memory device 912. In case that the computing system 901 is a mobile device, a battery (not shown) for supplying an operation voltage to the computing system 901 may be further provided. The computing system 901 of the present invention may further include an application chipset, a CMOS image processor CIS, a mobile DRAM, etc.

The output device or user interface 940 may be a self-contained display in the case of a portable electronic device. The input device or modem 950 may be a physical keyboard or a virtual keyboard in the case of a portable electronic device such as i.e. a smartphone, tablet pc, labtop, etc. The portable electronic device may further include, without limitation, a trackball, touchpad, or other cursor control device combined with a selection control, such as a pushbutton, to select an item highlighted by cursor manipulation. The memory system 910 may include a semiconductor memory device as described in FIG. 8.

As is apparent from the above description, the stack package according to various embodiments of the present invention may reduce the number of chip selection pads without increasing the size of a stack package when stacking semiconductor chips.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A stack package comprising:
a plurality of stacked chips; and
a chip selection controller configured to provide a reference signal and a chip selection control signal to the plurality of chips,
wherein each of the chips comprise:
a reference signal controller configured to transmit the reference signal through a first line interconnecting the plurality of chips;
a chip selection delay unit configured to control a delay timing point of the chip selection control signal in different ways so as to transmit the control result to each node of a second line interconnecting the plurality of chips;
a delay-time-difference sensing unit configured to calculate a delay time difference between a signal applied to each node of the first line and a signal applied to each node of the second line so as to generate chip selection information corresponding to the calculated delay time difference; and
a memory unit configured to store the chip selection information.

2. The stack package according to claim 1, wherein the chip selection controller respectively supplies the reference signal and the chip selection control signal having the same delay timing point to a first node of the first line and a first node of the second line during a power-up operation.

3. The stack package according to claim 1, wherein the delay time difference gradually increases on the second line.

4. The stack package according to claim 1, wherein the chip selection control signal passing through the chip selection delay unit on the second line has a constant delay time difference at each node, and is sequentially enabled.

5. The stack package according to claim 1, wherein the chip selection controller selects the corresponding chip by adjusting an enable timing point of the chip selection control signal during a normal operation.

6. The stack package according to claim 1, wherein the chip selection controller synchronizes an enable timing point of the reference signal applied to a first node of the first line with an enable timing point of a signal applied to a specific node of the second line, such that it selects the corresponding chip.

7. The stack package according to claim 1, wherein the reference signal controller is a Through Silicon Via (TSV) contained in the plurality of chips.

8. The stack package according to claim 1, wherein the chip selection controller includes:
a delay unit coupled to the second line; and
a delay controller configured to delay the chip selection control signal applied to the second line, and output the delayed result to each node.

9. The stack package according to claim 8, wherein the delay controller is coupled in parallel to the delay unit.

10. The stack package according to claim 8, wherein the delay unit is a Through Silicon Via (TSV) contained in each of the chips.

11. The stack package according to claim 8, wherein the delay controller includes a capacitor.

12. A stack package comprising:
a plurality of stacked chips; and
a chip selection controller configured to provide a first reference signal, a second reference signal, and a chip selection control signal to the plurality of chips,
wherein each of the chips comprise:
a first reference signal controller configured to transmit the first reference signal through a third line interconnecting the plurality of chips;
a second reference signal controller configured to transmit the second reference signal through a fourth line interconnecting the plurality of chips;
a chip selection delay unit configured to control a delay timing point of the chip selection control signal in different ways so as to transmit the control result to each node of a fifth line interconnecting the plurality of chips;
a delay-time-difference controller configured to calculate a delay time difference between a signal applied to each node of the third line and a signal applied to each node of the fourth line so as to generate chip selection information corresponding to the calculated delay time difference, and decode chip selection information; and
a memory unit configured to store the chip selection information and decoded information of the delay-time-difference controller.

13. The stack package according to claim 12, wherein the chip selection controller supplies the first reference signal and the chip selection control signal having the same delay timing point to a first node of the third line and a first node of the fifth line during a power-up operation.

14. The stack package according to claim 12, wherein the delay time difference gradually increases on the fifth line.

15. The stack package according to claim 12, wherein the chip selection control signal passing through the chip selection delay unit on the fifth line has a constant delay time difference at each node, and is sequentially enabled.

16. The stack package according to claim 12, wherein the chip selection controller selects the corresponding chip by combining the first reference signal with the second reference signal during a normal operation.

17. The stack package according to claim 12, wherein the delay-time-difference controller selects the corresponding chip when a combination signal of the first reference signal and the second reference signal is identical to a decoded signal stored in the memory unit.

18. The stack package according to claim 12, wherein the first reference signal controller is a resistor coupled to the third line, and the second reference signal controller is a resistor coupled to the fourth line.

19. The stack package according to claim 12, wherein the chip selection controller includes:
   a delay unit coupled to the fifth line; and
   a delay controller configured to delay the chip selection control signal applied to the fifth line, and output the delayed result to each node.

20. The stack package according to claim 19, wherein the delay controller is coupled in parallel to the delay unit.

* * * * *